United States Patent [19]

Matsunaga et al.

[11] Patent Number: 5,742,097
[45] Date of Patent: Apr. 21, 1998

[54] MULTILEVEL SEMICONDUCTOR INTEGRATED CIRCUIT DEVICE

[75] Inventors: Hayami Matsunaga; Masao Iwata, both of Hirakata; Yoshikazu Suehiro, Ikoma; Hideo Kurokawa, Hirakata; Izumi Okamoto, Osaka, all of Japan

[73] Assignee: Matsushita Electric Industrial Co., Ltd., Osaka, Japan

[21] Appl. No.: 782,302

[22] Filed: Jan. 15, 1997

Related U.S. Application Data

[63] Continuation of Ser. No. 223,517, Apr. 5, 1994, abandoned.

[30] Foreign Application Priority Data

Apr. 5, 1993 [JP] Japan ..................... 5-077822

[51] Int. Cl.⁶ .......................................... H01L 23/02
[52] U.S. Cl. ........................................ 257/686; 257/668
[58] Field of Search ............................ 257/668, 686, 257/735, 777, 685

[56] References Cited

U.S. PATENT DOCUMENTS

| | | | |
|---|---|---|---|
| 4,437,235 | 3/1984 | McIver | 257/735 |
| 4,982,265 | 1/1991 | Watanabe et al. | |
| 4,996,583 | 2/1991 | Hatada . | |
| 5,138,438 | 8/1992 | Masayuki . | |
| 5,394,300 | 2/1995 | Yoshimura . | |
| 5,490,041 | 2/1996 | Furukawa et al. | 361/777 |

FOREIGN PATENT DOCUMENTS

| | | |
|---|---|---|
| 56-24955 | 3/1981 | Japan . |
| 63-18654 | 1/1988 | Japan . |
| 3-203259 | 9/1991 | Japan . |
| 4-26152 | 1/1992 | Japan . |
| 5-14427 | 2/1993 | Japan . |
| 5-235259 | 9/1993 | Japan . |
| 6-112404 | 4/1994 | Japan . |

*Primary Examiner*—Jerome Jackson
*Assistant Examiner*—Nathan Kelley
*Attorney, Agent, or Firm*—Ratner & Prestia

[57] ABSTRACT

Two modules, each of which has a plurality of memory IC chips installed therein, are stacked to form a module unit. Furthermore, a plurality of the module units are installed on a mother board so as to form a multilevel semiconductor integrated circuit device. By further stacking a specific module containing an IC chip for replacing the functions of a defective chip, a repair process can be conducted more easily and efficiently. Alternatively, instead of the module units, a plurality of TAB packages stacked in a multilayer structure are installed on the mother board. Outer leads of each of the TAB packages and terminal pads on the circuit board are respectively connected to each other in a one-to-one way. Thus, only a defective TAB package need be taken away and consequently, efficiency in the repair process further improves.

11 Claims, 10 Drawing Sheets

F I G. I

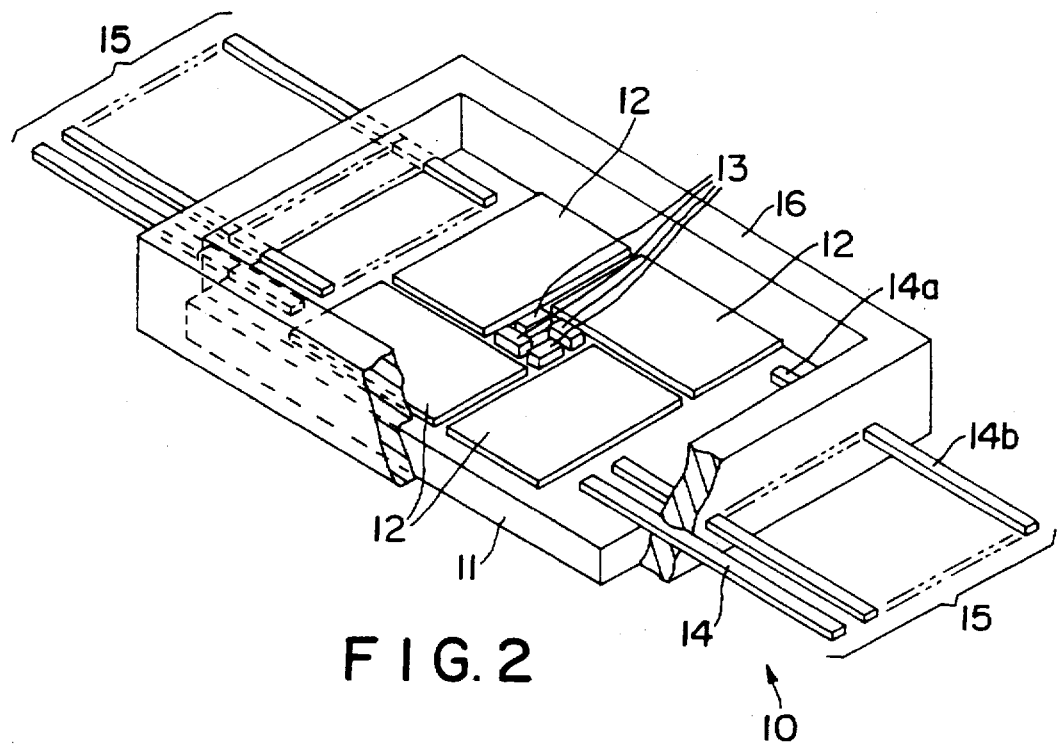
F I G. 2
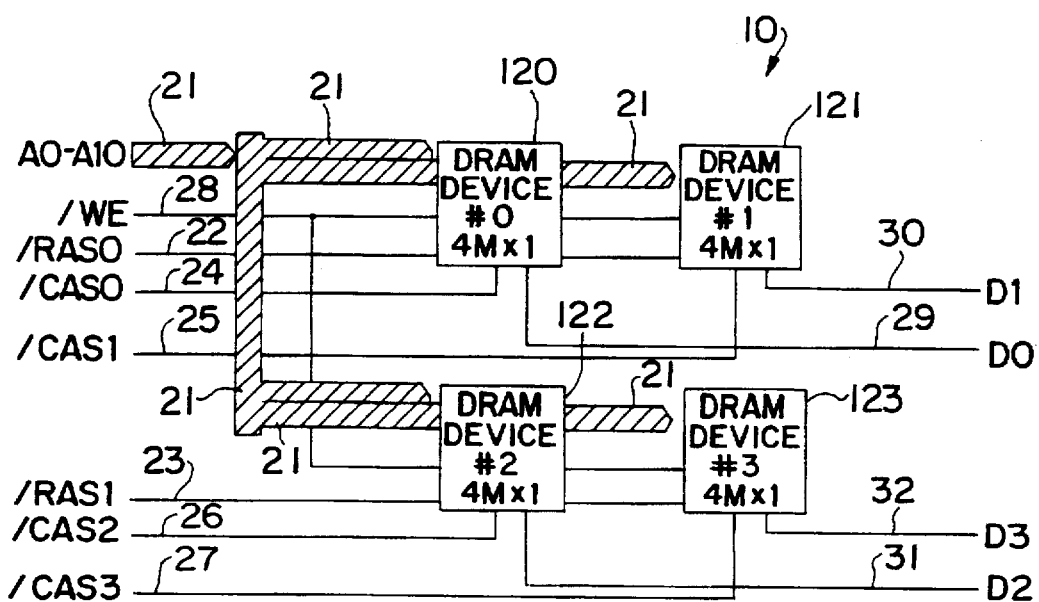
F I G. 3

MULTILEVEL SEMICONDUCTOR INTEGRATED CIRCUIT DEVICE

This application is a continuation of application Ser. No. 08/223,517 filed Apr. 5, 1994, now abandoned.

BACKGROUND OF THE INVENTION

1. Field of the Invention

This invention relates to a multilevel semiconductor integrated circuit device in which semiconductor IC chips and electronic components are integrated with high integration and compact installation.

2. Description of the Related Art

Semiconductor integrated circuit devices having semiconductor IC chips and electronic components integrated therein are used in various electronic circuit devices. Conventional semiconductor integrated circuit devices have two-dimensionally installed ICs on printed circuit boards (referred to as circuit boards hereafter). Those ICs are packaged in molded plastic cases and usually soldered onto the circuit boards.

The conventional semiconductor integrated circuit devices will be explained by way of integrated memory circuits in which monolithic memory IC chips are installed.

Recent miniaturization of electronic apparatus increasingly requires integrated memory circuits with higher integration and more compact memory IC installation. However, the conventional integrated memory circuits having two-dimensionally installed memory ICs have the following problems.

(1) Recent high performance CPUs demand a larger memory capacity in the main memory circuit. The memory capacity can be doubled by using memory ICs at the same capacity, not only twice the number of memory ICs are required, but the circuit board areas for the memory ICs also increase twice or more. Consequently, the miniaturization of the electronic circuit devices having integrated memory circuits can not be attained.

(2) Increasing the circuit board areas for the reason described in (1) raises the production cost of the integrated memory devices because the circuit board is expensive. Moreover, it results in longer wirings on the circuit boards, increasing wiring impedance. Consequently, the devices suffer from the deterioration of transmission characteristic such as signal waveform change, and deterioration of response characteristic for high frequency signals.

(3) The circuit board areas for memory ICs are slightly reducible using memory ICs whose package sizes are made smaller by narrowing the pitches between their terminals. However, since conventional chip mounting techniques can not be applied to the memory ICs having narrow pitched terminals, sophisticated mounting techniques are required.

In order to overcome the problems of the conventional integrated memory circuits of the two-dimensional installation type, for example, Japanese Patent Publication No. 5-14427 and U.S. Pat. No. 4,982,265 disclose multilevel integrated memory circuits on which a plurality of memory IC chips are installed in multiple levels. On these multilevel integrated memory circuits, lead terminals for selectively accessing any desired one of the IC chips in respective levels (referred to as selection terminals hereafter) that are formed in different shapes and provided at different positions. These terminals are individually and independently connected to the circuit board, while the terminals having the common functions for the memory IC chips in respective levels, such as power supply terminals or ground terminals (referred to as common terminals hereafter) are interconnected to each other and coupled with one and the same pad on the circuit board by soldering or other techniques.

However, such conventional multilevel integrated memory circuits with lead terminals connected in the above-described manner have the following problems.

(1) For common terminals, because the lead terminals of the memory IC chips in respective levels are typically soldered so as to be connected to each other without any modification, the physical strength in the connection portions is insufficient. Furthermore, their smaller connection areas cause electrical instability due to contact resistance variation. The electrical connections are especially instable when the lead terminal shapes change, and so the connections sometimes fail.

(2) Because all the common terminals of the memory IC chips at the respective levels are soldered together, when there is a defect in a memory IC chip in any of the levels and a repair is required, all the levels need to be removed even for repairing only one level.

Japanese Laid-Open Patent Publication No. 4-26152 discloses a multilevel integrated memory circuit designed to solve these problems. In the multilevel integrated memory circuit, each memory IC chip for multilevel installation has its terminals at different positions so as to prevent the terminals from overlapping the terminals of the other memory IC chips. More specifically, the lead terminals of one memory IC chip are provided only in one assigned portion of the sides of the memory IC chip. The assigned portion is different from those of the other IC chips. Accordingly, after the multilevel installation, the terminals of the respective memory IC chips are separately and independently connected to the circuit board without overlapping each other. This terminal arrangement in the multilevel integrated memory circuit disclosed in this publication allows only a memory IC chip in a specific level to be removed, whereby the repair efficiency is improved.

However, due to this terminal arrangement, each IC chip has a smaller number of terminals than that of conventional IC chips unless the pitches between the terminals are narrowed. This sometimes causes the IC functions to be limited.

SUMMARY OF THE INVENTION

The multilevel semiconductor circuit device of this invention includes a mother board on which at least one module unit is installed, the module unit including a lower module and an upper module stacked on the lower module, wherein each of the lower module and the upper module includes: a circuit board having a first face and a second face; a plurality of semiconductor devices mounted on at least one of the first and the second faces of the circuit board; a first terminal row for transmitting signals to or from the plurality of semiconductor devices, the first terminal row having a plurality of terminals formed along one of peripheral edges of the circuit board; and a second terminal row being electrically separate from the plurality of semiconductor devices, the second terminal row having a plurality of terminals formed along opposing peripheral edge to the first terminal row.

In one embodiment, at least one of the plurality of semiconductor devices of at least one of the upper and the lower modules is a memory device.

In another embodiment, the lower module and the upper module are stacked in such a way that the second terminal row of the upper module is positioned over the first terminal row of the lower module.

In still another embodiment, each of the plurality of terminals of the upper module is electrically connected to the respective ones of the plurality of terminals of the lower module at respective corresponding positions.

In still another embodiment, the plurality of terminals of the upper and the lower modules have a rectangular shape. Alternatively, the plurality of terminals of the upper module have a rectangular shape, and the plurality of terminals of the lower module have a gull-wing shape.

In still another embodiment, in at least one of the upper and the lower modules, the plurality of semiconductor devices are four semiconductor devices, the four semiconductor devices being arranged in a square area in an arrangement in which a longer peripheral edge and a shorter peripheral edge of adjacent devices are placed side by side. Preferably, at least one capacitor is installed in the center portion of the square area.

In still another embodiment, the plurality of semiconductor devices are installed on the circuit board by face-down bonding. Alternatively, the plurality of semiconductor devices are attached to the circuit board by die bonding and electrically connected to a circuit pattern on the circuit board by wire bonding.

In still another embodiment, the plurality of semiconductor devices are TAB package chips fabricated into a tape carrier package structure.

In still another embodiment, the mother board includes a male contact of a card-edge connector.

In still another embodiment, at least one of the at least one module unit includes a driver module, the driver module comprising a driving means for reenergizing an input signal to other module units.

In still another embodiment, at least one of the at least one module unit includes a specific semiconductor device for replacing functions of other semiconductor devices.

In still another embodiment, this invention further includes an interconnection for transmitting data in a unit of a plurality of bits to or from at least one of the at least one module unit.

According to another aspect of the invention, the multilevel semiconductor integrated circuit device of this invention includes a mother board on which at least one module unit part is installed, the module unit part including a multilayer structure in which a plurality of TAB packages being stacked, wherein each of the plurality of TAB packages comprises: a quadrangular insulating film frame; a plurality of inner leads extending inside the film frame; a plurality of outer leads extending outside the film frame along at least one peripheral edge thereof and being electrically connected with the plurality of inner leads; and a semiconductor device supported by the plurality of inner leads and being electrically connected with the plurality of inner leads.

In one embodiment, the semiconductor device of at least one of the plurality of TAB packages is a memory device.

In another embodiment, the mother board includes a male contact of a card-edge connector.

In still another embodiment, at least one of the at least one module unit part includes a specific TAB package, the specific TAB package including a driving means for re-energizing an input signal to other module unit parts.

In still another embodiment, at least one of the at least one module unit part includes a specific semiconductor device for replacing functions of other semiconductor devices.

In still another embodiment, a plurality of terminal pads are formed on the mother board for connecting to the plurality of outer leads of the plurality of TAB packages, the plurality of terminal pads being arranged in a first and a second terminal pad rows which are opposed to each other, each of the plurality of terminal pads being connected in a one-to-one way to the respect outer leads.

Preferably, each of the plurality of TAB packages are single-end type having the plurality of outer leads along only one peripheral edge thereof, and the plurality of outer leads of the TAB packages in layers of an odd number in the multilayer structure are connected to respective terminal pads in a cyclic way in the first terminal pad row, and the plurality of outer leads of the TAB packages in layers of an even number in the multilayer structure are connected to respective terminal pads in a cyclic way in the second terminal pad row.

More preferably, the first and the second terminal pad rows are arranged along two parallel lines. Alternatively, the terminal pads in the first and the second terminal pad rows are respectively arranged in a staggered way. Furthermore, the terminal pads in the first and the second terminal pad rows may be further arranged in dual rows respectively, and each pair of the corresponding terminal pads located at the respective corresponding positions in the dual lines may be located along a line perpendicular to the dual lines.

In still another embodiment, a plurality of terminal pads are formed on the mother board for connecting to the plurality of outer leads of the plurality of TAB packages, the plurality of terminal pads being arranged so as to be grouped into four groups, the four groups forming four edges of a quadrangular, each of the plurality of terminal pads being connected in a one-to-one way to the respective outer leads.

In still another embodiment, this invention further comprises an interconnection for transmitting data in a unit of a plurality of bits to or from at least one of said plurality of TAB packages.

Thus, the invention described herein makes possible the advantage of providing a multilevel semiconductor integrated circuit device having the following features: (1) a more compact installation of ICs due to multilevel integration, (2) less deterioration of signal transmission characteristics and response characteristics for high frequency signals, (3) high efficiency in the repair process for defective semiconductor devices mounted thereon, and (4) an easy selection of bit width of data signals to be input/output.

These and other advantages of the present invention will become apparent to those skilled in the art upon reading and understanding the following detailed description with reference to the accompanying figures.

BRIEF DESCRIPTION OF THE DRAWINGS

FIG. 2 is a perspective view showing a structure of a module in the first example of the invention.

FIG. 3 is a circuit diagram of the module.

DESCRIPTION OF THE PREFERRED EMBODIMENTS

Hereafter, the present invention will be described by way of illustrating embodiments. In the following description, the present invention is applied to a memory circuit. Therefore, a multilevel semiconductor integrated circuit device is referred to as a multilevel integrated memory circuit.

EXAMPLE 1

Figure 1:
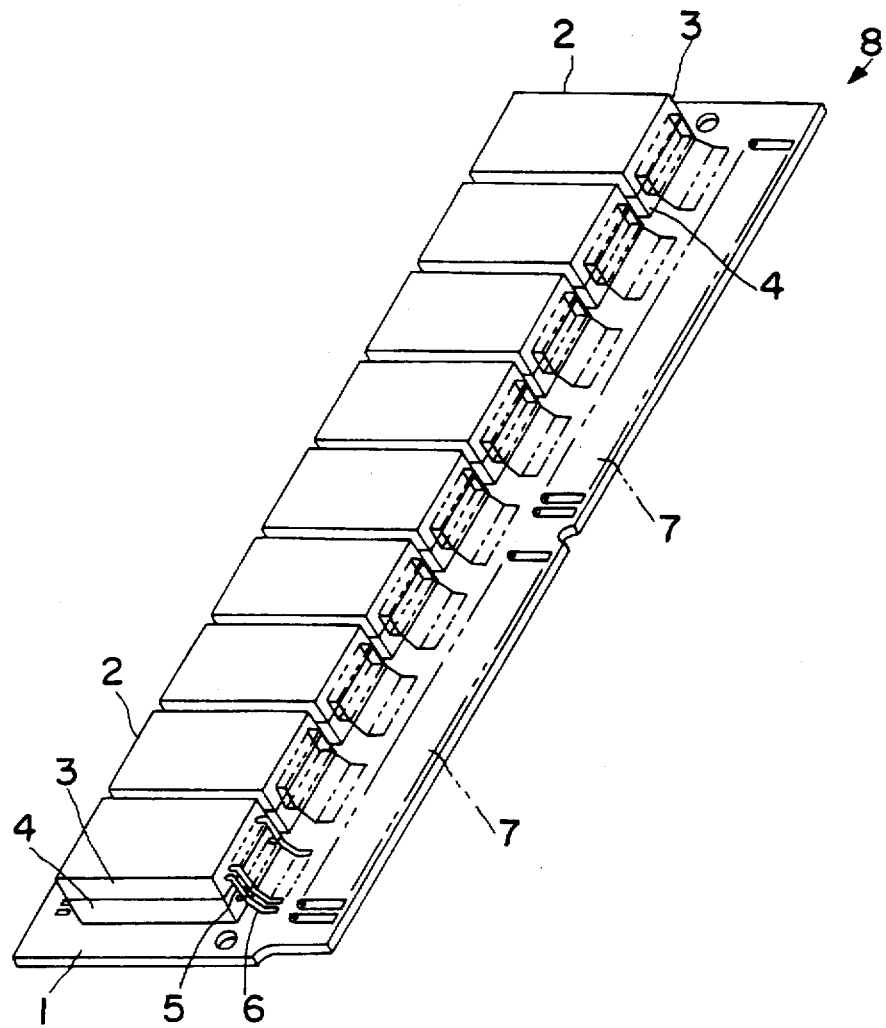
FIG. 1 is perspective view of a module board having a multilevel integrated memory circuit in first example of the invention.

FIG. 1 shows a perspective view of a module board 8 having a multilevel integrated memory circuit in a first example of this invention.

In this invention, modules which have a plurality of semiconductor devices are utilized for achieving higher integration and more compact installation in the semiconductor circuit devices. More particularly, two modules are provided. One of them is a first module 3, and the other one is a second module 4. The first module 3 is stacked on the second module 4 so as to form a module unit 2. In FIG. 1, nine module units 2 are mounted on a copper-coated multilayer circuit board 1 (referred to as a circuit board hereafter), which acts as a mother board, so as to form the module board 8. The size of the module board 8 is typically 107.95 mm×24.5 mm, and the size of the first and the second modules 3 and 4 is typically 11 mm ×16 mm.

The second module 4 has gull-wing shaped lead terminals 6 which are electrically connected to the circuit board 1. The first module 3 has ]-shaped lead terminals 5 (referred to as rectangular bracket-shaped lead terminals hereafter) which are electrically connected to the gull-wing shaped lead terminals 6 of the second module 4. Thus, both the first module 3 and the second module 4 are electrically connected to the circuit board 1. As is further described later, the first module 3 and the second module 4 have the same structure except the shape of their lead terminals.

The rectangular bracket-shaped lead terminals 5 of the first module 3, which is installed in the upper portion of the multilayer structure, makes it possible to bring sufficient connection areas between the lead terminals of the respective modules. Thus, physical strength and electrical stability at the connection portions are attained. Moreover, the increase in the connection areas can be realized only with minor changes in design.

The module board 8 preferably has male contacts 7 of a card-edge connecter. If each module board 8 has the male contacts 7 of the card-edge connecter, and if the mother board on which these module boards 8 are to be mounted has corresponding female contacts of the card-edge connecter, either increasing or reducing the memory capacity can be done only by inserting or withdrawing the card-edge connecter.

In the example shown in FIG. 1, the gull-wing shaped lead terminals 6 and the rectangular bracket-shaped lead terminals 5 of the module units 2 are arranged in parallel with the terminal row of the male contacts 7 of the card-edge connecter, but the arrangement of the terminals is not restricted to such an arrangement.

Next, with reference to FIG. 2, the structure of the first module 3 and the second module 4 (collectively referred to as a module 10 hereafter) will be described below.

Each module 10 has a module substrate 11 as a circuit board within a quadrangular insulating package 16. Memory IC chips 12 and surface mounted chip-capacitors 13 (simply referred to as chip-capacitors hereafter) are provided on the module substrate 11.

Lead terminal rows 15 have a plurality of lead terminals 14 arranged in parallel with each other. The memory IC chips 12 and the chip-capacitors 13 are electrically connected to an external circuit through the lead terminal rows 15. The lead terminal rows 15 are formed through the package 16 so as to extend toward both the inside and outside of the package 16 on its opposing side faces. Each lead terminal 14 is supported by the package 16. The portion of each lead terminal 14 extending inside of the package 16 is referred to as an inner lead 14a and the portion thereof extending outside of the package 16 is referred to as an outer lead 14b.

As mentioned above, the first module 3 and the second module 4 have the same structure except in the shape of the lead terminals 14. Specifically, the lead terminals are formed on the rectangular bracket-shape in the first module 3 and on the gull-wing shape in the second module 4.

The memory IC chips 12 may be mounted on the module substrate 11 by forming bumps on the electrode pads (not shown) on the memory IC chip 12 and connecting the bumps to the wiring pattern (not shown) of the module substrate 11 by face down bonding. Alternatively, the memory IC chip 12 may be attached to the module substrate 11 by die bonding, and the electrode pads on the memory IC chip 12 may be connected to the wiring pattern of the module substrate 11 by wire bonding.

In the example shown in FIG. 2, the memory IC chips 12 are attached on the module substrate 11 and arranged so that the longer side and the shorter side of adjacent chips are arranged side by side in the square region. Four chip-capacitors 13 are attached in the same arrangement in the center portion of the square region surrounded by the memory IC chips 12. Each of the chip-capacitors 13 is disposed across a power supply line and a ground line which are connected with the respective corresponding memory IC chips 12. This arrangement of the memory IC chips 12 and the chip-capacitors 13 in the module 10 reduces installation areas, and attains compact installation.

The circuit diagram of the module 10 in this example will be described below with reference to FIG. 3. In this example, the module 10 has four 4 Mbit DRAMs 120–123 (referred to as DRAMs #0–#3 hereafter) as the four memory IC chips 12. Thus, one module 10 has a memory capacity of 16 Mbit in total.

Address buses 21 for carrying address signals A0–A10, and a /WE line 28 for carrying data write signals (write enable signals) are connected to the DRAMs #0–#3 in common. A power supply line and a ground line (not shown in FIG. 3) are also connected to the DRAMs #0–#3 in common. The chip-capacitor 13 shown in FIGS. 1 and 2 (not shown in FIG. 3) is disposed across the power supply line and the ground line for surge absorption or the like.

As lines for carrying row address strobe signals, a /RAS0 line 22 connected to the DRAM #0 and DRAM #1 and a /RAS1 line 23 connected to the DRAM #2 and DRAM #3 are provided. To the DRAMs #0–#3, /CAS0–/CAS3 lines 24–27 for carrying column address strobe signals to each DRAM, and data buses D0–D3 29–32 for inputting and outputting data to and from each DRAM are connected, respectively. The input and output data are carried bit by bit through each of the data buses D0–D3 29–32.

In the module 10 employing this circuit construction, the bit width of input/output data is selectable from 1 bit, 2 bits and 4 bits by appropriately interconnecting row and column address strobe signal lines (/RAS0, /RAS1, /CAS0–/CAS3) so as to apply such combined address strobe signals.

For example, applying individual signals through all the row and column address strobe signal lines (/RAS0, /RAS1, /CAS0–/CAS3) without any interconnection enables a separate 1-bit data to be input and output using each of the data buses D0–D3 respectively connected to the DRAMs #0–#3 as a unit. Alternatively, interconnecting all the /CAS0–/CAS3 lines to each other before the application to the module 10 and leaving /RAS0 and /RAS1 lines separate enable 2-bit data to be input and output using each of the combination of data buses D0 and D1 and the combination of data buses D2 and D3 as a unit. Interconnecting all of /RAS0, /RAS1, and /CAS0–/CAS3 to each other before the application to the module 10 enables 4-bit data to be input and output using the combination of data buses D0–D3 as a unit.

Next, the signal assignment to the lead terminal rows 15 of the module 10 will be described below, referring to FIG. 4.

As described above, each module 10 has two lead terminal rows 15 along the side faces opposing each other. For the purpose of explanation, the left one of the lead terminal rows 15 in FIG. 4 is referred to as the lead terminal row 15b, and the right one is referred to as the lead terminal row 15a. The lead terminal row 15b has non-connected terminals (referred to as NC terminals hereafter) which are not used for transmitting the signals in the module 10. The lead terminal row 15a is used for transmitting the signals. The exemplary uses of the terminals are, from one end to the other end, a ground terminal 20a, address bus (A0–A10) terminals 21a, row address strobe signal (/RAS0 and /RAS1) terminals 22a and 23a, column address strobe signal (/CAS0–/CAS3) terminals 24a –27a, a write enable signal (/WE) terminal 28a, data bus (D0–DS) terminals 29a –32a, and a power supply terminal 33a.

In order to assemble the module unit 2, two modules 10 having the same structure and terminal assignment as described are used, one for the first module 3 and the other for the second module 4. Then, the lead terminal rows of the second module 4 are formed in a gull-wing shape and the lead terminal rows of the first module 3 are formed in a rectangular bracket-shape.

The modules are placed so that the lead terminal row 15a of the first module 3, which are used for transmitting the signals, is placed on the lead terminal row 15b of the NC terminals of the second module 4. The module unit 2 is accordingly assembled by putting the first module 3 on the second module 4 and soldering the corresponding lead terminal rows 15 with each other. Then, each module unit 2 is attached on the circuit board 1.

As described before, in the module 10 of this example, the bit width of the input-output data is selectable from 1-bit, 2 bits, or 4 bits by appropriately interconnecting the row and column address strobe signal lines (/RAS0, /RAS1, /CAS0–/CAS3) to apply the address strobe signals. Making the connections between the signal lines in the module unit 2 in the similar manner enables input-output data operations with any bit width from 1-bit to 8-bit.

For example, applying separate signals to all the /RAS and the /CAS signal lines of the first module 3 and the second module 4 without interconnecting any of them enables a 1-bit input-output data operation.

Interconnecting the respective address bus terminals A0–A10 of the first module 3 and the second module 4 externally to the modules (for example, A0 bus terminal of the first module 3 and A0 bus terminal of the second module 4) and leaving other terminals unconnected enables 2-bit input-output data operation. In this instance, 2-bit data is carried through pairs of corresponding data bus lines of the first module 3 and the second module 4 (e.g., D0 bus of each module). Alternatively, interconnecting the /CAS signal terminals of the first module 3 and the second module 4, respectively, externally to the modules and leaving other terminals unconnected also enables 2-bit input-output data operation. In this instance, 2-bit data are carried through the data buses D0, D1 and D2, D3 of the first module 3, and D0, D1 and D2, D3 of the second module 4.

For 4-bit input-output data operation, the corresponding address buses A0–A10 of the first and the second modules 3 and 4 (for example, A0 data bus terminal of the first module 3 and A0 terminal of the second module 4) are respectively interconnected with each other. In addition, a set of the /CAS signal line terminals and a set of the /RAS signal line terminals of the first module 3, and a set of the /CAS signal line terminals and a set of the /RAS signal line terminals of the second module 4 are interconnected respectively within the respective terminal sets. Independent signals are applied to the respective data buses and the respective terminal sets. In this case, data is carried through D0–D3 buses of the first module 3 and D0–D3 buses of the second module 4.

Alternatively, 4-bit input-output data operation is enabled by respectively interconnecting the corresponding address buses A0–A10 of the first and the second modules 3 and 4 as well as interconnecting the set of the /CAS signal line terminals of the first module 3 and the set of the /CAS signal line terminals of the second module 4 within the respective terminal sets and leaving the rest of the terminals unconnected. Thus, 4-bit input and output data is carried through D0, D1 of the first module 3 and D0, D1 of the second module 4; and through the remaining 4 buses.

For 8-bit input-output data operation, interconnecting the corresponding respective address buses A0–A10 of the first and the second modules 3 and 4 externally to the modules as well as respectively interconnecting the set of the /CAS signal line terminals of the first module 3, the set of the /CAS signal line terminals of the second module 4, and a set of all the /RAS signal line terminals of both the first and the second modules 3 and 4. Applying independent signals for the respective sets of the terminals, the input and output data is carried through all the data buses of the first and the second modules 3 and 4 combined.

Figure 5:
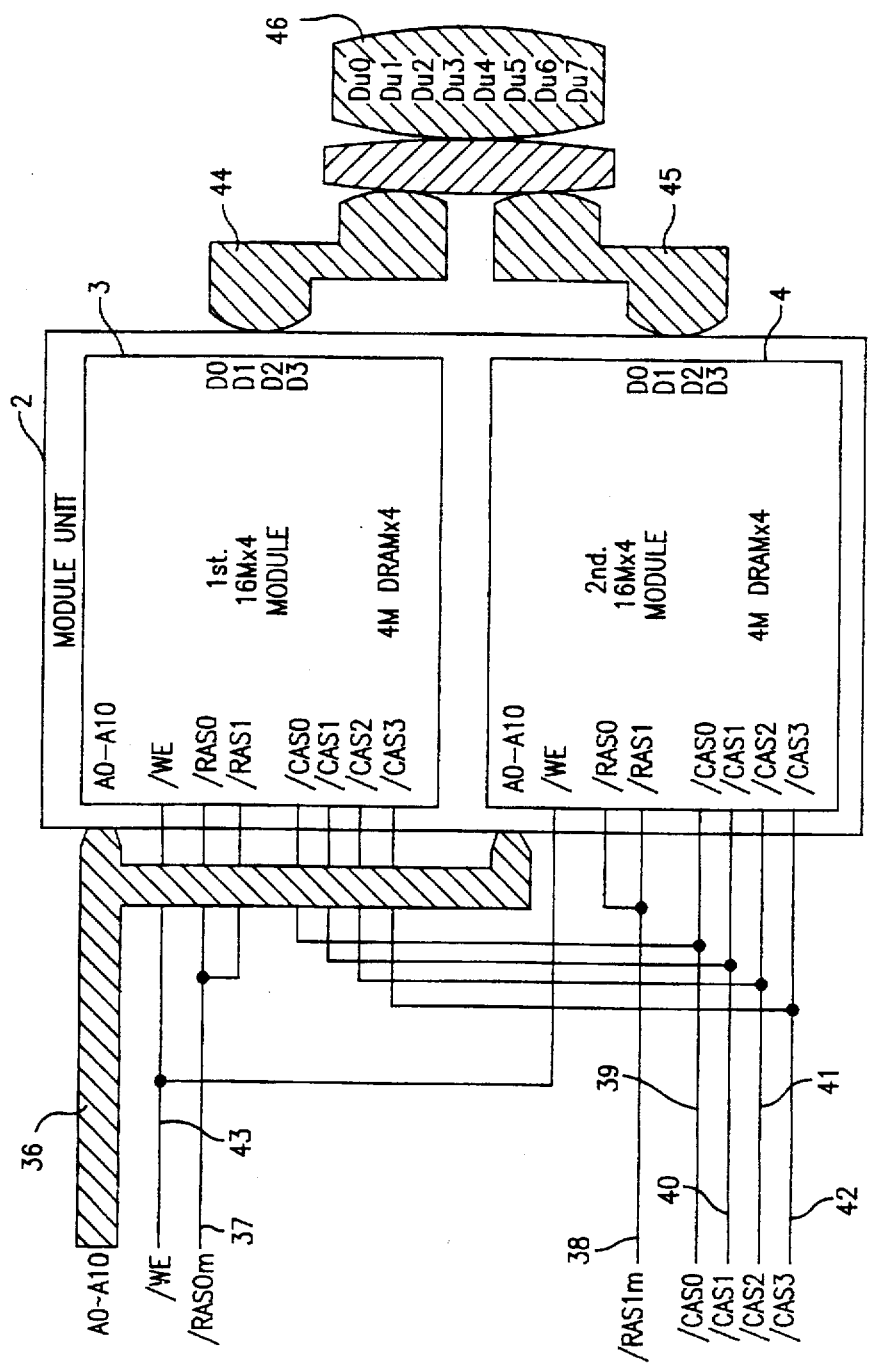
FIG. 5 is a circuit diagram of a peripheral circuit connecting a module unit to an external circuit in the first example.

The peripheral circuit around the lead terminal rows 15 of the module unit 2 will be described with reference to FIG. 5. FIG. 5 shows the circuit which is wired to enable 8-bit input-output data operation.

Figure 4:
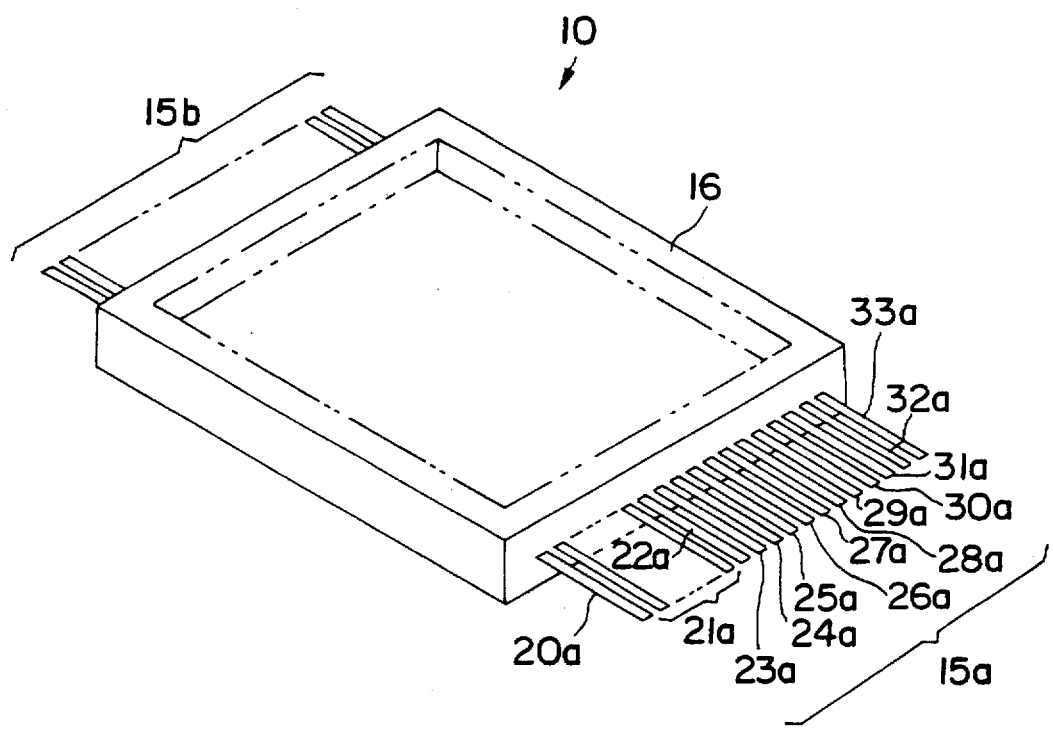
FIG. 4 illustrates the signal assignment to lead terminals of the module.

The module unit 2 is assembled by putting the first module 3 on the second module 4 (see FIGS. 2–4 for the structure, circuit, and signal assignment to the lead terminal rows of the modules). Because the first module 3 and the second module 4 each have a memory capacity of 16 Mbit as described before, the module unit 2 has a memory capacity of 32 Mbit in total.

As described with reference to FIG. 3, the address buses A0–A10, the data buses D0–D3, and the lines for /WE, /RAS0, /RAS1 and /CAS0–/CAS3 signals are connected to the modules 3 and 4 of the module unit 2.

Address bus 36, a /WE signal line 43 and respective /CAS signal lines 39–42 are interconnected externally to the module unit 2 and wired for applying the same signals to the respective corresponding terminals of the first module 3 and the second module 4. The two /RAS signal lines of the first module 3 and the two /RAS signal lines of the second module 4 are respectively interconnected externally to the module unit 2 so as to be coupled as a /RAS0m signal line 37 to apply a /RAS signal to the first module 3 and as a /RAS1m signal line 38 to apply a /RAS signal to the second module 4.

The first module 3 and the second module 4 respectively have 4-bit data buses 44 and 45 each consisting of the data buses D0–D3. These data buses are coupled to an 8-bit data bus 46 consisting of Du0–Du7.

The wiring for power lines and ground lines are not shown in FIG. 5.

With independent signals applied to each of the buses and the lines 36–42, this circuit enables 8-bit input-output data operation through the 8-bit data bus 46.

Next, a circuit diagram of a memory block 160 having a plurality of the module units 2 and other modules will be described referring to FIG. 6.

Figure 6:
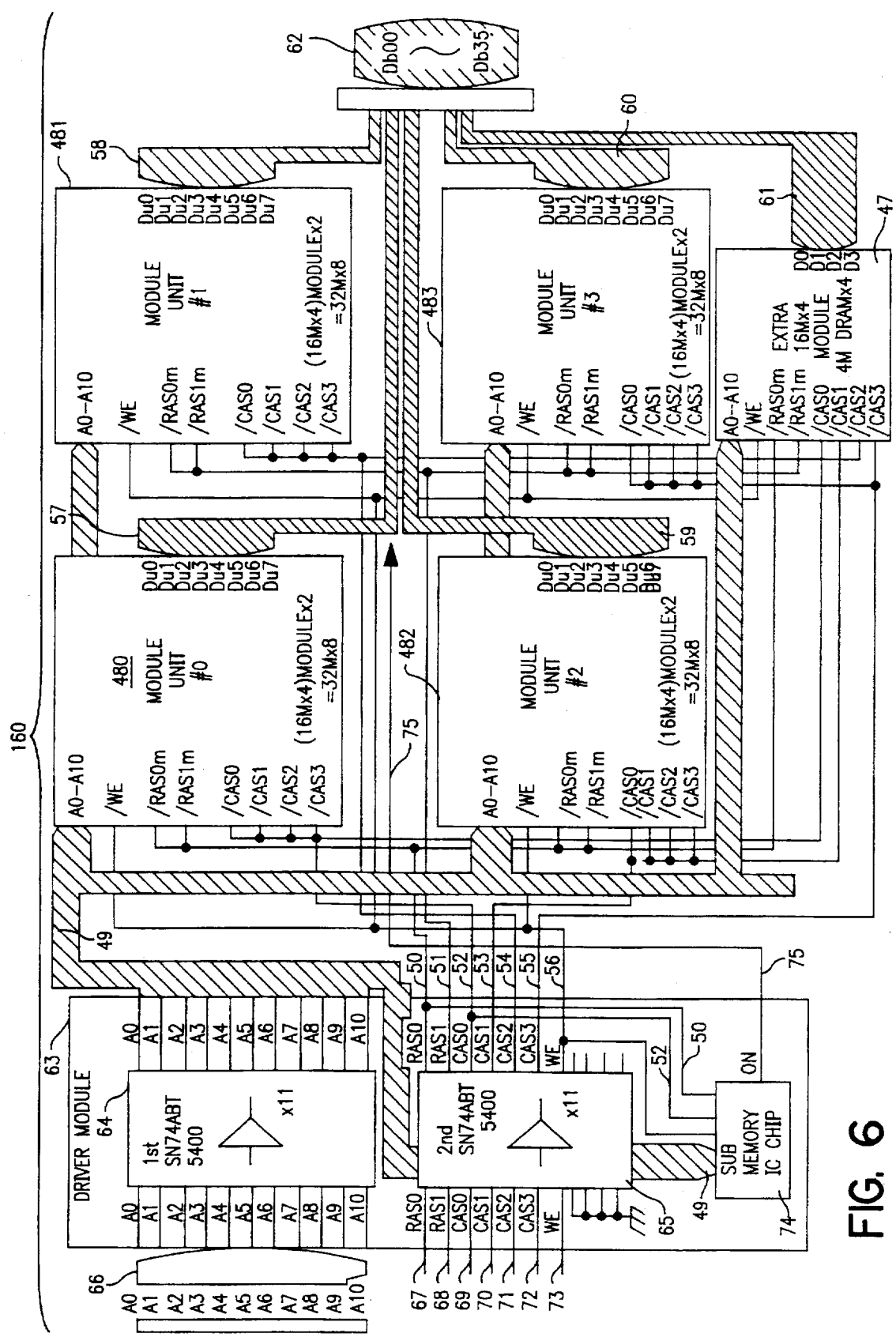
FIG. 6 is a circuit diagram of a memory block.

A memory block 160 as shown in FIG. 6 includes four module units #0–#3 480–483, as well as an extra-module 47 and a driver module 63 separate from the module units 480–483. The extra-module 47 has the circuit described with reference to FIG. 3 and includes four 4 Mbit DRAMs, thus having a memory capacity of 16 Mbit.

The terminals of the four module units #0–#3 480–483 are connected with each other for 8-bit input-output data operation as described with reference to FIG. 5. Each of the module units 480–483 each have a memory capacity of 32 Mbit in total as described in FIG. 5. The buses and the lines (A0–A10, /WE, /RAS0m, RAS1m, /CAS0–/CAS3) connected with each of the module units 480–483 have the same functions as those described with reference to FIG. 5. Data buses Du0–Du7 are connected for 8-bit input-output data operation as described referring to FIG. 5.

The wirings for these module units #0–#3 480–483 and for the extra-module 47 will be described below.

An address bus line 49 is connected with all the module units #0–#3 480–483 and with the extra-module 47 in common. Similarly, a /WE signal line 56 is also connected with all the module units 480–483 and with the extra-module 47 in common. Therefore, address signals and a /WE signal are commonly applied to all the memory IC chips in the memory block 160.

The /RAS signal lines and the /CAS signal lines are selectively interconnected with each other to selectively apply signals to particular units among the module units #0–#3 480–483 and the extra-module 47.

For instance, the /RASm0 and the /RASm1 signal lines of the module units #0 and #2 and the /RAS0 signal line of the extra-module 47 are interconnected so as to be coupled as one signal line RAS0 50. Similarly, the other /RAS signal lines in the memory block 160 are interconnected so as to be coupled as another signal line RAS1 51.

All the /CAS signal lines of the module unit #0 and the /CAS0 signal line of the extra-module 47 are interconnected so as to be coupled as a signal line CAS0 52. Similarly, all the /CAS signal lines of the module unit #1 and the /CAS1 signal line of the extra-module 47, all the /CAS signal lines of the module unit #2 and the /CAS2 signal line of the extra-module 47, and all the /CAS signal lines of the module unit #3 and the /CAS3 signal line of the extra-module 47 are respectively interconnected so as to be coupled as respective signal lines CAS1, CAS2, CAS3 53–55.

The four 8-bit data buses 57–60 of Du0–Du7 of the respective four module units #0 –#3 and the 4-bit data bus 61 of D0–D3 of the extra-module 47 are combined together so as to be coupled as a 36-bit data bus Db00–Db35 62.

The memory block 160 shown in FIG. 6 further includes the driver module 63. The driver module 63 has a first driver IC chip 64 and a second driver IC chip 65 for each non-inversely driving the eleven signal lines, and a sub-memory IC chip 74 (described more completely below).

The driver module 63 is incorporated as the second module as described with reference to FIG. 1 and the gull-wing shaped lead terminals are provided on the module 63. The extra-module 47 is incorporated as the first module and the rectangular bracket-shaped lead terminals are provided on this module. In order to incorporate these modules, the extra-module 47 as the first module is placed on the driver module 63 as the second module, making them a unit like other module units 480–483, and installed on the circuit board 1.

In this example, SN74ABT5400 from Nippon Texas Instruments is used respectively as the first and the second driver IC chips 64 and 65 in the driver module 63. However, this does not limit the invention and other equivalent driver ICs may be used.

The first driver IC chip 64 receives address signals (A0–A10) as its input signals to produce the output on the address buses A0–A10 49 which are connected to the module units #0 –#3. The seven input terminals 67–73 among the input terminals of the second driver IC chip 65 receive /RAS, /CAS, and /WE signals as their input signals to produce the output on the /RAS0 signal line 50, the /RAS1 signal line 51, the CAS signal lines /CAS0–/CAS3 52–55, and the /WE signal line 56.

The signal wave forms to be applied to the memory block 160 is refresh-shaped by the first and the second driver IC chips 64 and 65 before actually being applied to the memory block 160. Since each signal wave is re-energized then, driving power is sufficiently recovered so as to drive many memory IC chips. As a result, excellent signals can be provided to many memory IC chips in the memory block 160 without reducing their transmission capacity.

The wirings for power supply lines and ground lines are not shown in FIG. 6. Also, the chip-capacitors to be connected across the power supply lines and the ground lines are not shown therein.

With the memory block 160 of above-described structure, some of the /RAS signal lines and the /CAS signal lines among the input lines of the second driver IC chip 65 are selectively interconnected with each other to make up groups, and signals are given to each of the groups, enabling 9-bit, 18-bit, or 32-bit input-output data operation.

For example, connecting RAS0 input line 67 and CAS0 input line 69, connecting RAS0 input line 67, CAS0 input line 69 and CAS1 input line 70, and connecting RAS0 input line 67, RAS1 input line 68 and all the CAS input lines 69-72 respectively enable the 9-bit, 18-bit, and 32-bit input-output data operation.

Figure 7:
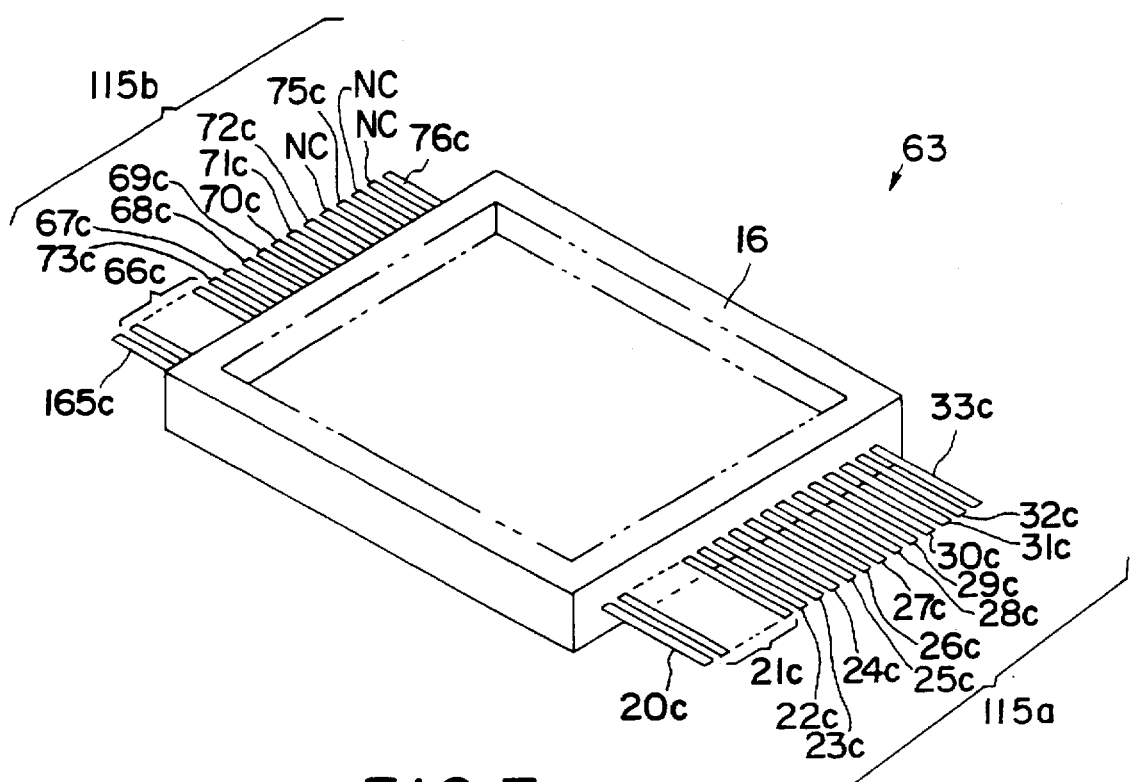
FIG. 7 illustrates the signal assignment to lead terminals of a driver module.

Next, the signal assignment to the lead terminal rows of the driver module 63 will be described with reference to FIG. 7.

The signal assignment of the lead terminal rows in the driver module 63 are essentially the same as those of the lead terminal rows of the common module 10 described with reference to FIG. 4. Specifically, one of the lead terminal rows 115a has the same terminal assignment as that of the lead terminal row 15a as described with reference to FIG. 4. On the other hand, the other lead terminal row 115b is used for the input lines to the driver module 63, while the lead terminal row 15b in FIG. 4 are an NC terminal row. More specifically, the terminals are assigned in the following order so that a power supply terminal 165c, a terminal 66c for an address bus 66, terminals 67c and 68c for /RAS signal lines 6Y and 68, terminals 69c -72c for /CAS signal lines 69-72, an NC terminal, a terminal 75c for data bus Dn 75 for a sub-memory IC chip, two NC terminals, and a ground terminal 76c.

As described before, the extra-module 47 is placed on the driver module 63. Specifically, the lead terminal row 115a of the driver module 63 and the lead terminal row 15a of the extra-module 47 which have the same terminal assignment, and the other lead terminal row 115b of the drive module 63 and the NC terminal row 15b of the extra-module 47 are placed and connected together. The connections of the output lines 49-56 of the driver module 63 are accordingly made without additional external circuits.

Since the lead terminal row 15b of the extra-module 47 is located corresponding to each of the input terminal of the driver module 63 consists of all NC terminals, the input signals for the driver module 63 does not affect the driver module 47 at all. Therefore, designing and producing a special module for placing on the driver module 63 is not necessary and the common first module 3 can be used.

The sub-memory 1C chip 74 will be described below with reference to FIG. 6. The sub-memory IC chip 74 is the 4-Mbit DRAM which is the same type of the other memory IC chips as used in each module unit. Thus the buses and the lines as described with the reference to FIGS. 3-6 are connected with the respective terminals in the same manner as they are coupled with each module unit #0-190 3 in the memory block 160. Specifically, the address buses A0-A10 are connected with the output lines of the first driver IC chip 64, /RAS and /CAS signal lines are connected with any one of the output lines of the second driver IC chip 65 (in the circuit shown in FIG. 6, RAS0 signal line 50 and CAS0 signal line 52). The /WE signal line is also connected with the corresponding WE signal line 56 of the second driver IC chip 65.

Figure 8:
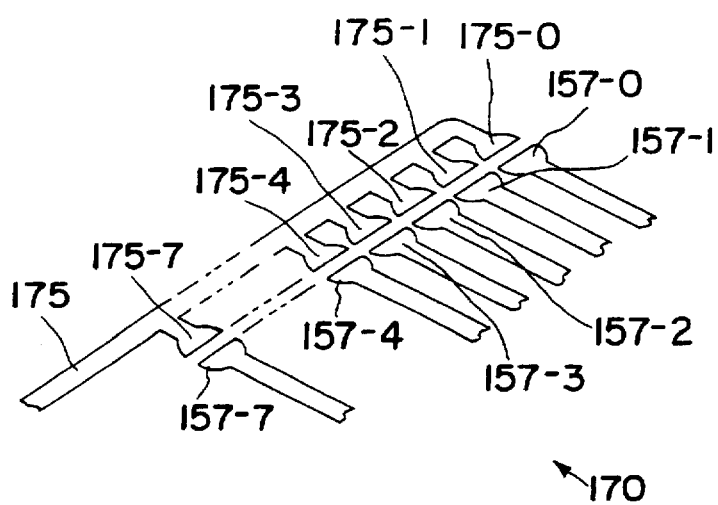
FIG. 8 shows a data signal switching section.

The data bus Dn 75 of the sub-memory IC chip 74 can be connected with any one of the data buses 57-61 of the module units #0-#3 and of the extra-module 47. For this purpose, a data signal switching section 170, shown in FIG. 8, is provided around the module unit #0.

Next, the data signal switching section 170 will be described below with reference to FIG. 8.

Branches 157-0-157-7 are patterned for each of the data bit lines Du0-Du7 in the data bus 57 of the module unit #0 in the data signal switching section 170. A branch 175 is also provided with the data bus Dn 75 of the sub-memory IC chip 74, and is patterned into the data switching section 170. The branch 175 of the data bus Dn further branches into sub-branches 175-0-175-7, and are disposed in so that they are opposite the respective corresponding branches 157-0-157-7 of the data bit lines Du0-Du7 with a small distance therebetween. Soldering pads are made at the tips of the branches 157-0-157-7 of the data bit lines Du0-Du7 and the sub-branches 175-0-175-7 of the data bus line Dn.

When a defective memory IC chip in a module or a module unit is found at a checking step before assembling into the memory block 160, the following steps are taken to replace the defective memory IC chip with the sub-memory IC chip.

First, the defective memory IC chip is electrically disconnected from the circuit. When the defective memory IC chip is wire-bonded to the circuit board, the wiring is cut. When it is attached on the circuit board with face-down bonding, the defective IC chip is physically removed. Then, the module or the module unit containing the defective memory IC chip is assigned to the module unit #0 shown in FIG. 6 and assembled on the memory block 160.

Since the defective memory IC chip corresponds to only 1 bit in the data buses Db00-Db35 62 of the memory block 160, the branch 157-0-157-7 of the data bit lines to which the defective memory IC was supposed to be assigned and was soldered to the corresponding sub-branch 175-0-175-7 of the data bus 175 of the sub-memory IC chip 74. Thus, the defective memory IC chip is electrically excluded from the circuit of the memory block 160, while the sub-memory IC chip 74 is incorporated in the circuit, completing-the function replacement.

In the above description, the branches 157-0-157-7 of the data bit lines Du0-Du7 are electrically separate from the sub-branches 175-0-175-7 at the beginning, and only the branch of the data bit line corresponding to the defective memory IC chip is soldered to the corresponding sub-branch. Alternatively, the branches 157-0-157-7 of the data bit lines Du0-Du7 and their opposing sub-branches 175-0-175-7 may be connected with each other in advance, for instance, by a printed circuit pattern, and the connections except the particular one to be used for replacing the defective memory IC may be disconnected.

Furthermore, a plurality of the data signal switching sections 170 may be provided and each of them may be disposed around The respective module units #0-#3. Thereby, the module unit or the module which requires replacing the defective memory IC chip does have to be necessarily assigned as the module unit #0. In addition, the circuit of the memory block 160 may be modified so as to include a plurality of the sub-memory IC chips for dealing with a plurality of defective IC chips.

Providing a sub-memory IC chip 74 having the above-described function in the memory block 160 and conducting a replacement of the defective IC chip with the sub-memory IC chip 74 by using the above circuit configuration, the efficiency in the repair process for the defective memory 1C chips is significantly improved.

Figure 9:
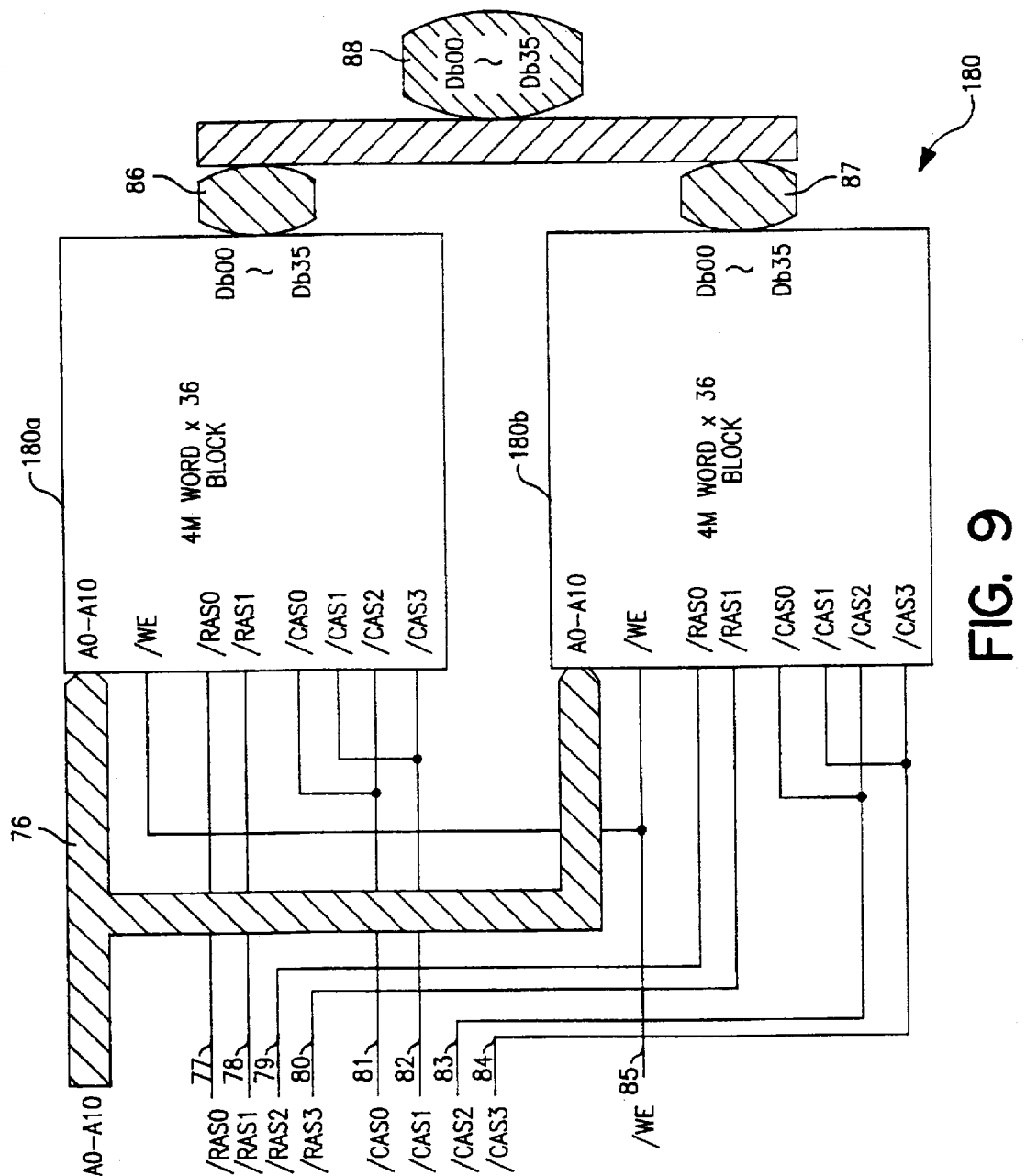
FIG. 9 is a circuit diagram of a module board having two memory blocks.

Next, with reference to FIG. 9, a module board 180 having two memory blocks 160 will be described below.

A first memory block 180a and a second memory block 180b in the module board 180 have the same structure as the memory block 160 shown in FIG. 6. Each of them has a memory capacity of 4 Mword. As with the previous examples, the address buses A0-A10 76, the /WE signal line 85, the /RAS and /CAS signal lines 77-84, and the data buses Db00-Db35 86 and 87 are connected to each of the first and the second memory blocks 180a and 180b.

Each of the memory blocks 180a and 180b has the 36-bit data bus 86 and 87 respectively, and these buses are interconnected so as to form another 36-bit data bus 88. The address buses 76 and the /WE signal line 85 are connected with the first and the second memory blocks 180a and 180b in common.

For /RAS signal lines, /RAS0 and /RAS1 signal lines 77 and 78 are respectively connected with /RAS0 and /RAS1 signal terminals of the first memory block 180a, while /RAS2 and/RAS3 signal lines 79 and 80 are respectively connected with /RAS0 and /RAS1 terminals of the second memory block 180b.

For /CAS signal lines, /CAS0 and /CAS2 signal terminals of the first memory block 180a are connected with each other and coupled with a /CAS0 signal line 81. The /CAS1 and /CAS3 signal terminals of the first memory block 180a are connected with each other and coupled with a /CAS1 signal line 82. A /CAS2 signal line 83 and a /CAS3 signal line 84 are connected with the second memory block 180b, in the same manner as the two /CAS signal lines 81 and 82.

The input-output data operation through the terminal data bus 88 can be made variable by selectively applying signals that appropriately interconnect the RAS0–/RAS3 signal lines 77–80 and the /CAS0–/CAS3 25 signal lines 81–84 as described before.

For instance, interconnecting the /RAS0 signal line 77 and the /CAS0 Signal line 81; the /RAS0 signal line 77, the /CAS0 signal line 81 and the /CAS1 signal line 82; and the /RAS0 signal line 77, the /RAS1 signal line 78, the /CAS0 signal line 81 and the /CAS1 signal line 82 respectively enable 9-bit, 18-bit, and 36-bit input-output data operations.

In the above description of the first example of the present invention with reference to FIGS. 1–9, the modules and the module units are installed only on one side of the circuit board. Alternatively, installing the modules and the module units on both sides of the circuit board can increase the memory capacity on the same area of the circuit board, or it can reduce the circuit board area by fabricating the memory circuit of the same total capacity. Both lead to a more compact memory IC chip installation.

Moreover, in the above description of the first example of the present invention, the first and the second modules 3 and 4 which have the same structure as each other are stacked so as to form the module unit 2. Then a plurality of the module units 2 are installed on the circuit board 1 to form the module board 8. However, the modules 3 and 4 may be installed in a single layer without stacking. Since the modules 3 and 4 themselves have a plurality of semiconductor devices in a compact installation, such a single layer installation can also bring a compact installation of the integrated memory circuit.

EXAMPLE 2

The first example explained above utilizes the modules in which the memory IC chips 12 are mounted on the module board 11 by face-down bonding or die bonding. On the other hand, the second example of the present invention utilizes TAB packages fabricated by a tape automated bonding (TAB) process.

A similar module board 8 as described previously with reference to FIG. 1 is also used. The memory IC chips installed in the modules 3 and 4 in the first example may be simply replaced with the TAB packages. Similar effects as explained with regard to the first example are still obtained in this case.

In this example, however, a plurality of TAB packages are installed on a circuit board 1 instead of installing the module units 2 in the following manner, so as to attain further effects.

Figure 10:
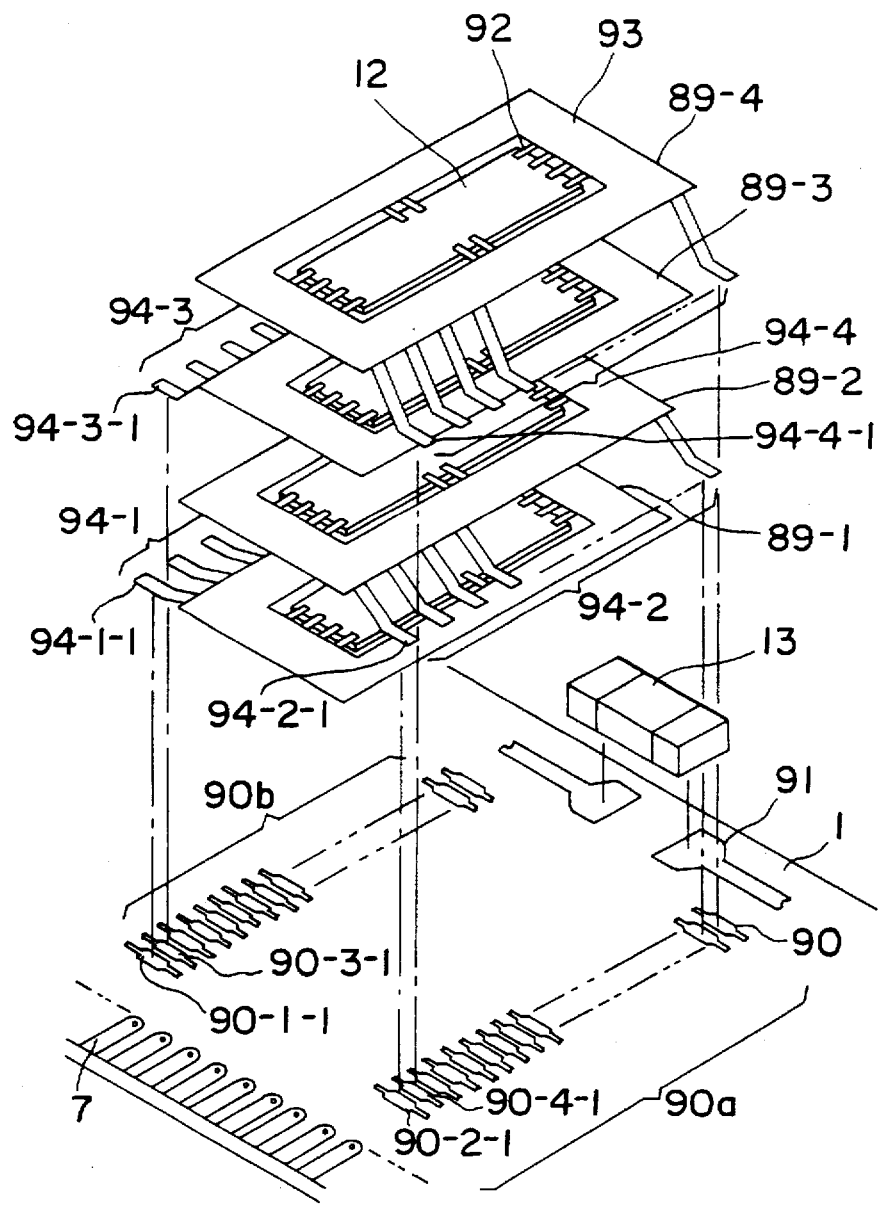
FIG. 10 is a partially enlarged perspective view of a module board having a multilevel integrated memory circuit in a second example of the invention.

With reference to FIG. 10, a method of installing the TAB packages in accordance with the present invention will be described.

FIG. 10 is a partially enlarged perspective view of the module board 8 which is similar to the one shown in FIG. 1. Male contacts 7 of a card-edge connecter are formed along one of the peripheral edges of copper-coated multi-layer circuit board 1 (referred to as a circuit board hereafter), similarly as in FIG. 1. In this example, each of the module units 2 in FIG. 1 are replaced with a first to fourth TAB packages 89-1–89-4.

Each of the TAB packages 89-1–89-4 has a quadrangular insulating film frame 93 and a memory IC chip 12. The memory IC chip 12 is soldered to the inner leads 92 which are formed along the inner edges of the film frame 93. Thus, by the soldering, the memory IC chip 12 is electrically connected to the inner leads 92 as well as being physically supported.

In addition, each of the inner leads 92 is connected to respective outer leads 94-1–94-4 which are formed so as to extend outside of the film frame 93. Therefore, the memory IC chip 12 of each of the TAB packages 89-1–89-4 can be connected to an external circuit pattern (not shown) on the circuit board 1 by soldering the outer leads 94-1–94-4 to terminal pads 90 formed on the circuit board 1.

In FIG. 10, each of the TAB packages 89-1–89-4 is a single-end type which has the outer leads 94-1–94-4 along either one of the longer edges of the film frame 93. The size of the TAB packages is typically 16 mm×7 mm.

On the circuit board 1, the chip-capacitors 13 are further installed via capacitor mounting pads 91.

One of significant features of this example of the present invention is that every terminal of the outer leads 94-1–94-4 is connected in a one-to-one way by soldering to the respective terminal pads 90. For the connection, the signals are assigned to each of the terminals in the following manner.

As described previously, in the case as shown in FIG. 10, four single-end type TAB packages 89-1–89-4 are installed, and every two of the four TAB packages are paired. For example, the first and the third TAB packages 89-1 and 89-3 are paired as a first pair, while the other two are paired as a second pair. Then, the outer leads 94-1 and 94-3 of the first pair are connected to the left terminal pad row 90b in FIG. 10, and the outer leads 94-2 and 94-4 of the second pair are connected to the right terminal pad row 90a, respectively.

The terminal pads in each of the terminal pad rows 90a and 90b are respectively arranged in a line. Moreover, in the right terminal pad row 90a, the terminal pads to be connected to the second TAB package 89-2 and the fourth TAB package 89-4 are positioned alternately. Similarly in the left terminal pad row 90b, the terminal pads to be connected to the first TAB package 89-1 and the third TAB package 89-3 are positioned alternately.

More particularly, the first outer lead terminal 94-2-1 of the second TAB package 89-2 is connected to the first terminal pad 90-2-1 in the right terminal pad row 90a. Then, the first outer lead terminal 94-4-1 of the fourth TAB package 89-4 is connected to the next terminal pad 90-4-1 in the right terminal pad row 90a. Similarly, the first outer lead terminal 94-1-1 of the first TAB package 89-1 is connected to the first terminal pad 90-1-1 in the left terminal pad row 90b. Then, the first outer lead terminal 94-3-1 of the third TAB package 89-3 is connected to the next terminal pad 90-3-1 in the left terminal pad row 90a.

Figure 11:
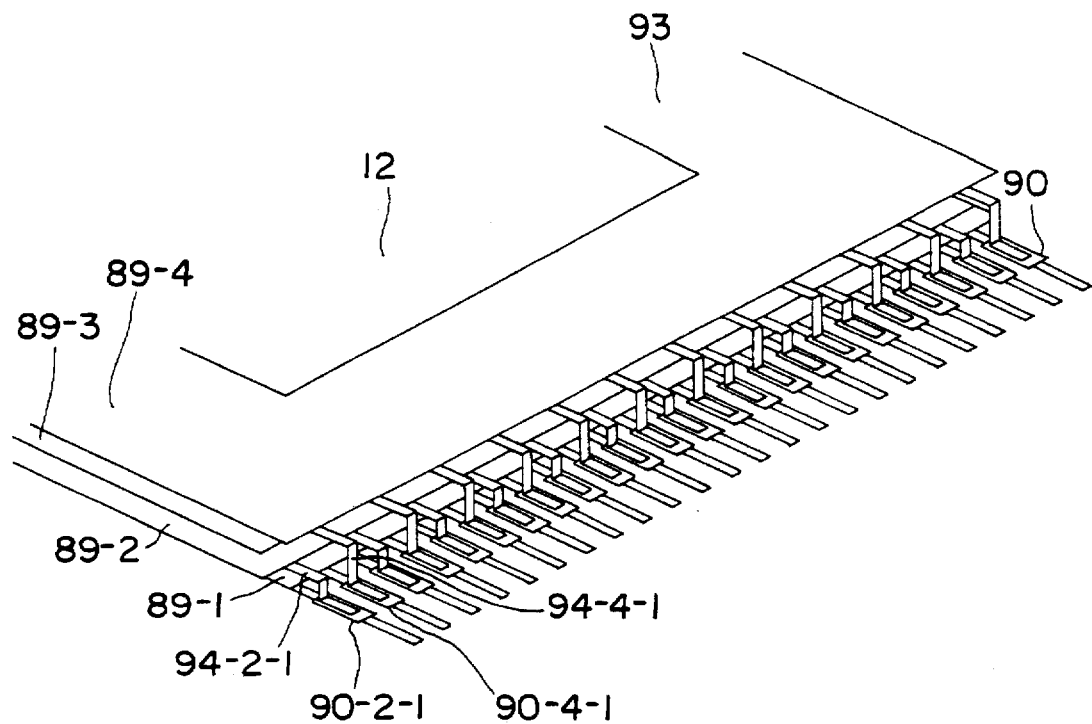
FIG. 11 shows an arrangement of the terminal pads to be connected with the outer leads of the TAB package in the second example of the invention.

In FIG. 11, the connection of the outer leads to the terminal pads in the right terminal pad row 90a is illustrated in detail. Connecting the outer leads and the terminal pads in this way makes it possible to independently connect each of a plurality of TAB packages to the circuit board 1 without sacrificing compactness of the installation. The above also makes it possible to remove only a defective TAB package installed on the circuit board, thus the repair process can be conducted efficiently.

Figure 12:
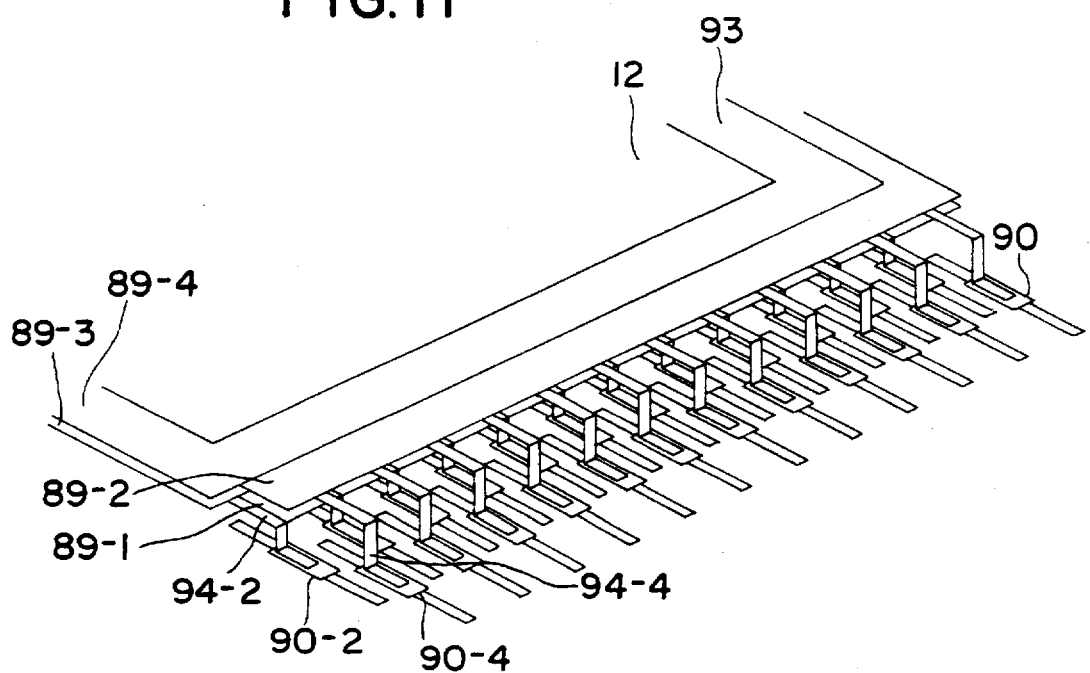
FIG. 12 shows another arrangement of the terminal pads to be connected with the outer leads of the TAB package in the second example of the invention.
Figure 13:
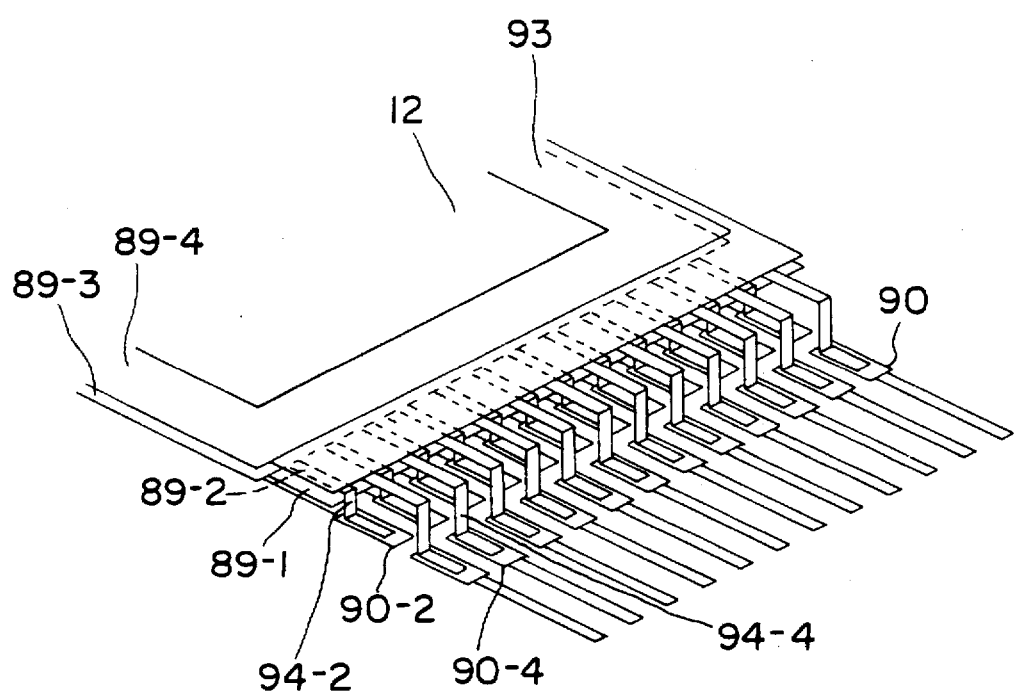
FIG. 13 shows still another arrangement of the terminal pads to be connected with the outer leads of the TAB package in the second example of the invention.

FIGS. 12 and 13 respectively show other arrangements of the terminal pads 90 which enable more compact installation while retaining the above advantages.

In the example as shown in FIG. 12, the terminal pads 90-2 to be connected to the outer leads 94-2 of the second TAB package 89-2 and the terminal pads 90-4 to be connected to the outer leads 94-4 of the fourth TAB package 89-4 are arranged in a staggered way. Thus, without narrowing the pitches between the outer leads of each TAB package, the interval between the neighboring terminal pads can be reduced. As a result, it is equivalent to narrowing the pitches of the outer leads of the TAB packages, resulting in a more compact installation.

FIG. 13 shows still another arrangement of the terminal pads which realizes further compact installation. In this case, the terminal pads 90-2 connecting to the second TAB package 89-2 and the corresponding terminal pads 90-4 connecting to the fourth TAB package 89-4 are respectively allocated in dual lines. Thus, the intervals between the terminal pads are further reduced than the previous cases.

The above description of the example of this invention with reference to FIGS. 10-13, single-end type TAB packages are used. Alternatively, dual-in type TAB packages may be similarly used and the same advantages can be attained.

Furthermore, in the above description, a pair of terminal pad rows 90a and 90b are formed along the opposing two edges of the rectangular installation area. Alternatively, four terminal pad rows may be formed along the four edges of a square installation area, which makes it possible to increase the number of stacked layers. Therefore, a more compact installation can be achieved.

As described above, the second example of the present invention differs from the first example in having a plurality of TAB packages installed on the circuit board instead of module units. However, by interconnecting the wirings as described similarly with reference to FIGS. 3, 5, 6 and 9 in the first example, the same advantages of the present invention can be attained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A multilevel semiconductor integrated circuit device comprising:

a mother board on which at least one module unit part is installed, said module unit part comprising a multilayer structure in which at least three of TAB packages are stacked, wherein each of said plurality of TAB packages comprises:

a quadrangular insulating film frame;

a plurality of inner leads extending inside said film frame;

a plurality of outer leads extending outside said film frame along at least one peripheral edge thereof and being electrically connected with said plurality of inner leads; and a semiconductor device supported by said plurality of inner leads and being electrically connected with said plurality of inner leads, and wherein a plurality of terminal pads are formed on said mother board for connecting to said plurality of outer leads of said plurality of TAB packages, wherein all the terminal pads on said mother board are arranged so as to be grouped into not more than two groups, said not more than two groups including first and second terminal pad groups which form opposing edges of a quadrangular installation area, each of said plurality of terminal pads being connected in a one-to-one way to said respective outer leads.

2. An integrated circuit device according to claim 1, wherein said semiconductor device of at least one of said plurality of TAB packages is a memory device.

3. An integrated circuit device according to claim 1, wherein said mother board comprises a male contact of a card-edge connector.

4. An integrated circuit device according to claim 1, wherein at least one of said at least one module unit part comprises a specific TAB package, said specific TAB package comprising a driving means for re-energizing an input signal to other module unit parts.

5. An integrated circuit device according to claim 1, wherein at least one of said at least one module unit part comprises a specific semiconductor device for replacing functions of other semiconductor devices.

6. An integrated circuit device according to claim 1, wherein each of said plurality of TAB packages are single-end type having said plurality of outer leads along only one peripheral edge thereof, and said plurality of outer leads of the TAB packages in layers of an odd number in said multilayer structure are connected to respective terminal pads in a cyclic way in said first terminal pad group, and said plurality of outer leads of the TAB packages in layers of an even number in said multilayer structure are connected to respective terminal pads in a cyclic way in said second terminal pad group.

7. An integrated circuit device according to claim 6, wherein said first and second terminal pad groups are arranged along two parallel lines.

8. An integrated circuit device according to claim 6, wherein said terminal pad groups are respectively arranged in a staggered way.

9. An integrated circuit device according to claim 6, wherein said terminal pads in each of said first and said second terminal pad groups are arranged in dual rows respectively, and each pair of the corresponding terminal pads located at the respective corresponding positions in said dual rows are located along a line perpendicular to said dual rows.

10. An integrated circuit device according to claim 1, further comprising circuitry including:

at least one address bus for carrying an address signal;

at least one /RAS line for carrying a row address strobe signal;

at least one /CAS line for carrying a column address strobe signal; and an interconnection for interconnecting prescribed lines selected from said at least one address bus, said at least one /RAS line and said at least one /CAS line, thereby transmitting data in a unit of a plurality of bits to or from at least one of said plurality of TAB packages.

11. An integrated circuit device according to claim 6, wherein said terminal pads in each of said first and second terminal pad groups are arranged to form respective first and second terminal pad rows, and said first and second terminal pad rows are arranged with respect to each other to form linear terminal pad columns, the total number of the terminal pad columns being equal to the total number of terminal pad pairs comprising each terminal pad column.

* * * * *